United States Patent [19]
Takano

[11] Patent Number: 5,329,254
[45] Date of Patent: Jul. 12, 1994

[54] SEMICONDUCTOR INTEGRATED CIRCUIT HAVING CLOCK SIGNAL GENERATOR

[75] Inventor: Chiaki Takano, Kanagawa, Japan

[73] Assignee: Sony Corporation, Tokyo, Japan

[21] Appl. No.: 924,515

[22] Filed: Aug. 4, 1992

[30] Foreign Application Priority Data

Aug. 9, 1991 [JP] Japan .................. 3-224766

[51] Int. Cl.⁵ .................. H03B 5/00; H03L 7/099
[52] U.S. Cl. ................. 331/34; 331/1 A; 331/17; 331/25; 331/57
[58] Field of Search .............. 331/1 A, 2, 17, 25, 331/34, 57, 74, 108 C, 111, 179

[56] References Cited

U.S. PATENT DOCUMENTS

| | | | |
|---|---|---|---|
| 4,380,742 | 4/1983 | Hart | 331/34 X |
| 4,639,687 | 1/1987 | Scholz | 331/34 X |
| 4,689,581 | 8/1987 | Talbot | 331/111 X |
| 4,868,522 | 9/1989 | Popat et al. | 331/2 |

FOREIGN PATENT DOCUMENTS

| | | |
|---|---|---|
| 0200797 | 5/1985 | European Pat. Off. |
| 0357527 | 8/1989 | European Pat. Off. |

OTHER PUBLICATIONS

Japanese Patent Publication No. 3-205942, Sep.-1991.
Patent Abstracts of Japan; vol. 14, No. 312 (E-948, Jul. 5, 1990 & JP-A-21 00 514 (Ricoh Co. Ltd.) Apr. 12, 1990.
Patent Abstracts of Japan, vol. 7, No. 103 (E-173 May 6, 1983 & JP-A-58 025 710 (Fujitsu KK) Feb. 16, 1983.
Patent Abstracts of Japan, vol. 10, No. 117 (E-400) May 2, 1986 & JP-A-60 250 712 (Toshiba KK) Dec. 11, 1985.

Primary Examiner—David Mis
Attorney, Agent, or Firm—Hill, Steadman & Simpson

[57] ABSTRACT

A semiconductor integrated circuit having a clock signal generator comprising a ring oscillator, a divider, a phase comparator, and an up-down counter. The ring oscillator provides variable oscillation frequencies determined by a sum of the delay times provided by the circuit elements constituting the oscillator. The divider divides the oscillation frequency from the ring oscillator by a specified number. The phase comparator compares the frequency of the signal from the divider with the frequency of the external clock signal. The up-down counter controls the oscillation frequency of the ring oscillator by selectively operating switches connected with the ring oscillator based on the comparison result from the comparator. The clock generator is controlled by an external clock signal to generate an internal clock signal having a higher frequency and outputs both signals. This makes it possible to constitute the semiconductor integrated circuit by using the digital integrated circuit technology alone, thereby allowing the slow operating semiconductors and fast operating semiconductors to exist on the same circuit without sacrificing the excellent characteristics of the latter.

4 Claims, 3 Drawing Sheets

SEMICONDUCTOR INTEGRATED CIRCUIT HAVING CLOCK SIGNAL GENERATOR

BACKGROUND OF THE INVENTION

1. Field of the Invention

The present invention relates to a semiconductor integrated circuit and, more particularly, to a semiconductor integrated circuit which is preferred to provide, by the digital circuit technology alone, a circuit for generating a clock signal having a frequency which is an integral multiple of the frequency of a clock signal given from the outside.

2. Description of the Prior Art

As already known, semiconductors constituted by using compounds consisting of two or more elements such as GaAs, InP, AlGaAs and InGaAs have come into use these days. As compared with widely used Si semiconductors, these compound semiconductors provide high-speed operations, having particular utility in ultra high-speed and high-frequency devices. However, while realizing high-speed operations, compound semiconductors present such shortcomings as having many crystalline defects caused by the electronic instability on crystalline surfaces, a low mechanical strength, and a high production cost.

These shortcomings make it difficult to provide all circuit elements necessary for constituting a circuit by using only compound semiconductors. Therefore, compound semiconductors are often used to supplement Si semiconductors in providing the characteristics which cannot be obtained from Si semiconductors alone. For these reasons, a combination of compound semiconductors and Si semiconductors are sometimes used on the same substrate constituting a circuit.

To operate an entire circuit consisting of both compound semiconductors and Si semiconductors with a single clock signal, the clock signal must have a frequency suitable for driving the Si semiconductors which operate more slowly than the compound semiconductors on the same circuit, thereby making it impossible to make the most of the excellent characteristic of the compound semiconductors, namely a high-speed operation.

A possible means for overcoming this problem to fully derive the advantage of the compound semiconductors is to operate the compound semiconductors and the Si semiconductors on the same circuit with separate clock signals.

To generate the clock signal for driving the compound semiconductors which operate more quickly than the Si semiconductors, control must be provided so that this clock signal is put in a certain relationship with the clock signal for driving the Si semiconductors.

A circuit for generating a clock signal in a certain relationship with another clock signal is generally comprised of a PLL circuit which consists of a phase comparator 1, a loop filter 2, a voltage control oscillator 3, and a 1/N divider 4 as shown in FIG. 1. However, the PLL circuit shown in FIG. 1 is an analog circuit, making it impossible to constitute the entire clock signal generating circuit by the digital integrated circuit technology alone. Consequently, integrating a circuit including a clock signal generator has heretofore required a complicated process.

OBJECT AND SUMMARY OF THE INVENTION

It is therefore an object of the present invention to provide by the digital integrated circuit technology alone a clock signal generator which generates a high-frequency clock signal controlled in a certain relationship with the clock signal given from the outside.

In carrying out the invention and according to one aspect thereof, there is provided a semiconductor integrated circuit having a clock signal generator comprising: a ring oscillator providing variable frequencies determined by a sum of the delay times provided by the circuit elements constituting the oscillator; a divider for dividing the oscillation frequency given from the ring oscillator by a specified number; a phase comparator for comparing the frequency of the signal given from the divider with the frequency of the clock signal given from the outside; and an up-down counter for controlling the oscillation frequency of the ring oscillator based on the comparison result from the phase comparator.

According to another aspect of the present invention, there is provided a semiconductor integrated circuit having a clock signal generator comprising: a ring oscillator for providing variable oscillating frequencies determined by a sum of the delay times provided by the circuit elements constituting the oscillator; a divider for dividing the oscillation frequency given from the ring oscillator by a specified number; a phase comparator for comparing the frequency of the output signal given from the divider with the frequency of the external clock signal given from the outside; and an up-down counter for controlling the oscillation frequency of the ring oscillator based on the comparison result from the phase comparator; wherein the clock signal generator, controlled by the externally entered clock signal to generate an internal clock signal of which frequency is higher than the frequency of the externally entered clock signal, outputs both internal and external clock signals.

According to further aspect of the present invention, there is provided a semiconductor integrated circuit having a clock signal generator comprising: a ring oscillator for providing variable oscillating frequencies determined by a sum of the delay times provided by the circuit elements constituting the oscillator; a divider for dividing the oscillation frequency given from the ring oscillator by a specified number; a phase comparator for comparing the frequency of the output signal given from the divider with the frequency of the external clock signal given from the outside; and an up-down counter for controlling the oscillation frequency of the ring oscillator based on the comparison result from the phase comparator; wherein the clock signal generator generates an internal clock signal of which frequency is higher than the frequency of the externally entered clock signal to operate the circuit elements internal to the clock signal generator at a high speed.

Each of the ring oscillator for providing variable oscillation frequencies, the divider for dividing the oscillation frequency from the ring oscillator by a specified number, the phase comparator for comparing the frequency of the output signal given from the divider with the frequency of the external clock signal given from the outside, and the up-down counter for controlling the oscillation frequency of the ring oscillator based on the comparison result from the phase comparator may be constituted by using the digital integrated circuit technology alone. Therefore, comprising a clock signal generator with these circuit elements makes it possible to provide, by the digital integrated circuit technology alone, a circuit which generates a high-frequency internal clock signal controlled by an external clock signal having a lower frequency.

DESCRIPTION OF THE PREFERRED EMBODIMENTS

Figure 1:
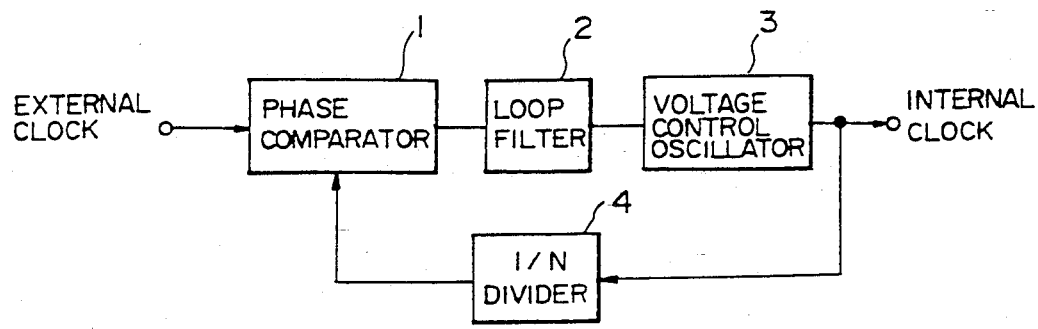
FIG. 1 is a block diagram illustrating an example of a prior art clock signal generating circuit.
Figure 2:
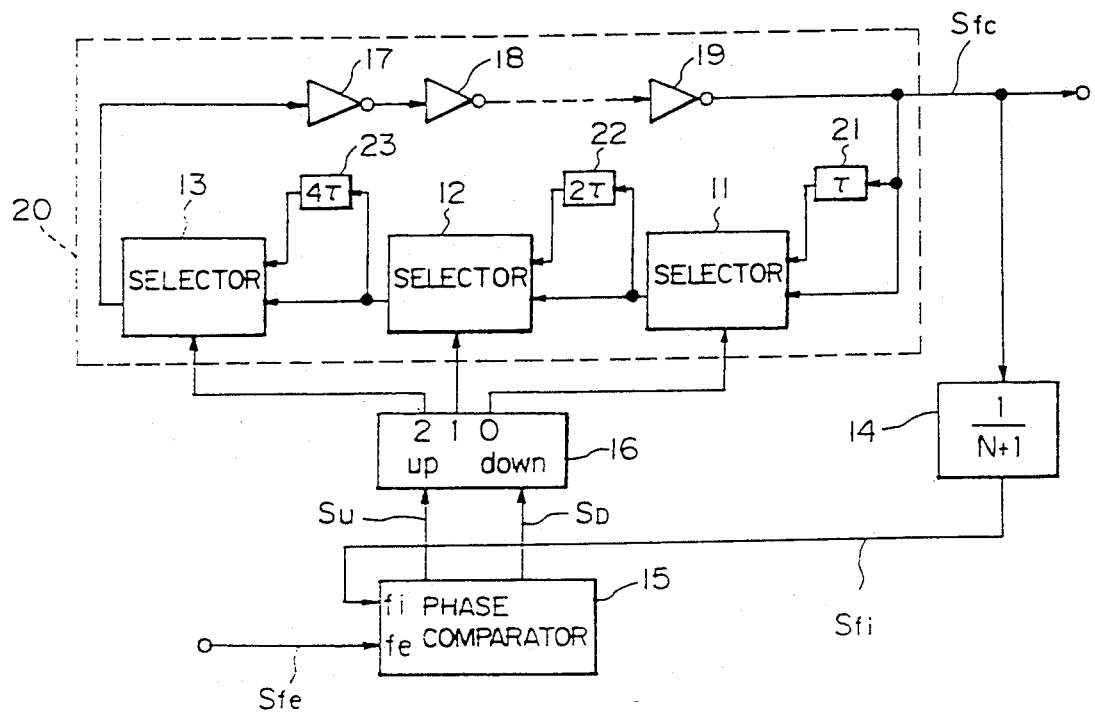
FIG. 2 is a block diagram illustrating of a semiconductor integrated circuit practiced as a first embodiment of the present invention.

FIG. 2 is a block diagram of a semiconductor integrated circuit practiced as the preferred embodiment of the invention.

Referring to FIG. 2, the semiconductor integrated circuit of the present embodiment is constituted a ring oscillator 20, a divider 14, a phase comparator 15, and an up-down counter 16.

The ring oscillator 20, consisting of first, second, and third selectors 11, 12, and 13, first, second, and third delay circuits 21, 22, and 23, and inverters 17, 18, and 19, oscillates at a frequency determined by a sum of the delay times provided by these delay circuits, the frequency being varied by a three-bit switching signal applied to the selectors 11, 12, and 13.

In the embodiment, the delay times provided by the delay circuits 21, 22, and 23 are set to $\tau$, $2\tau$, and $4\tau$, thus making it possible to vary the oscillation period of the ring oscillator 20 from t to $(t+7\tau)$ at an interval of r by the switching signal. That is, the oscillation frequency can be varied from $1/t$ to $1/(t+7\tau)$. Note that the interval t is the period provided by making the ring oscillator 20 operate in the mode in which the clock signal does not pass through all the delay circuits 21, 22, and 23.

The delay circuits 21, 22, and 23 for varying the oscillation frequency can be respectively provided by an even number of inverters. The up-down counter 16 increments the output value by one when the count-up signal $S_U$ is applied to the count-up signal input terminal up and decrements the output value by one when the count-down signal $S_D$ is applied to the count-down signal terminal down.

A divider 14 divides the frequency of the signal supplied to it by $(N+1)$. For example, suppose that a 16-bit multiplier is installed on an integrated circuit containing the clock signal generator of the embodiment; to generate the clock for operating the 16-bit multiplier, the divider 14 having a dividing factor of 1/17 is used because N is 16 in this example.

Figure 3:
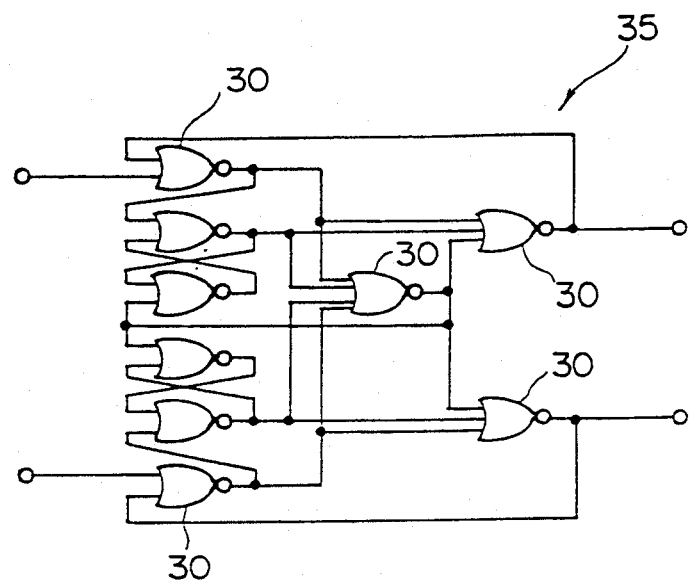
FIG. 3 is a block diagram illustrating an example of the phase comparator on the semiconductor integrated circuit practiced as the first embodiment of the present invention shown in FIG. 2.

A phase comparator 15 compares the divider output signal $S_{fi}$ with the external clock signal $S_{fe}$. If the divider output signal $S_{fi}$ is found leading the external clock signal $S_{fe}$ in phase, the count-down signal $S_D$ is set to the logical high level. Conversely, if the divider output signal $S_{fi}$ is found lagging behind the external clock signal $S_{fe}$ in phase, the count-up signal $S_U$ is set to the logical high level. The phase comparator 15 thus operating may be constituted by using a plurality of NOR circuits 30 as shown in FIG. 3.

Figure 4:
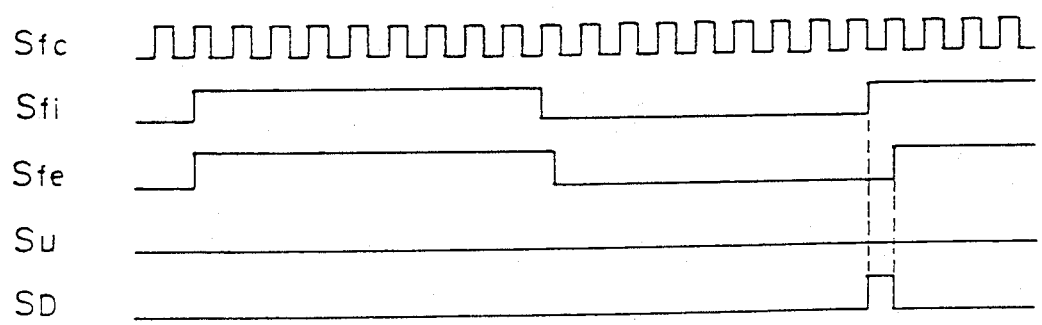
FIG. 4 is a timing chart illustrating the phase lead operation of the phase comparator on the present invention shown in FIG. 3.
Figure 5:
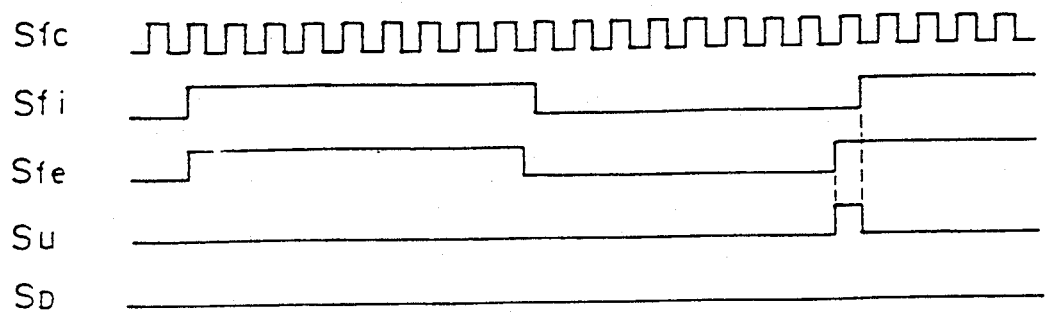
FIG. 5 is a timing chart illustrating the phase lagging operation of the phase comparator on the present invention shown in FIG. 3.

FIG. 4 and FIG. 5 show the timing charts which represent how the output signals from the phase comparator 15 change in accordance with the input signals to the phase comparator 16. Particularly, FIG. 4 shows the state in which the divider output signal $S_{fi}$ is leading the external clock signal $S_{fe}$ in phase and FIG. 5 shows the state in which the divider output signal $S_{fi}$ is lagging behind the external clock signal $S_{fe}$ in phase.

As clearly be understood from FIG. 4, if the divider output signal $S_{fi}$ is leading the external clock signal $S_{fe}$ in phase, the count-down signal SD is set to the logical high level; if the divider output signal $S_{fi}$ is lagging behind the external clock signal $S_{fe}$ in phase, the count-up signal $S_U$ is set to the logical high level.

Based on the above-described circuit operations, the embodiment in its entirety is considered to operate in the following manner. Namely, if the frequency of the internally generated clock signal $S_{fc}$ is higher than $(n+1)$ or 17 times the frequency of the external clock signal $S_{fe}$, the divider output signal $S_{fi}$ obtained by dividing the internally generated clock signal $S_{fc}$ by 17 by the divider 4 is compared with the external clock signal $S_{fe}$ by the comparator 5, thereby generating the count-down signal $S_D$. This signal is applied to the count-down signal input terminal down of the up-down counter 6 to decrement the value of the three-bit output signal by one.

The three-bit signal is applied to the selectors 11, 12, and 13 of the ring oscillator 20 to increment by $\tau$ the sum of the delay times provided by the delay circuits 21, 22, and 23, thereby lowering the oscillation frequency of the ring oscillator 20. The resulting frequency is compared by the phase comparator 15 again. This operation is repeated until the oscillation frequency of the internal clock signal gets lower than $(n+1)$ times the frequency of the external clock signal.

If, on the other hand, the oscillation frequency of the internally generated clock signal $S_{fc}$ gets lower than $(n+1)$ times the frequency of the external clock signal $S_{fe}$, the phase comparator 15 puts out the count-up signal $S_U$, thereby raising the oscillation frequency of the ring oscillator 20.

Thus, the internally generated clock signal $S_{fc}$ given from the ring oscillator 20 is controlled so that the period of the signal obtained by dividing the internally generated clock signal by $(n+1)$ gets in the range of $2\tau$ around the period of the external clock signal $S_{fe}$. That is, the frequency of the internally generated clock signal $S_{fc}$ is always controlled to a level near $(n+1)$ times the frequency of the external clock signal $S_{fe}$.

Suppose that the internal clock of a certain semiconductor integrated circuit is made to operate at a frequency higher than the external clock signal $S_{fe}$ given from an input terminal of the circuit, thereby providing a 16-bit time-division addition-type multiplier. In this case, one 16-bit multiplying operation can be replaced with 16 partial product adding operations. That is, the 16-bit time-division addition-type multiplier may be regarded as an adder which makes one multiplying operation by making 16 adding operations with one adder within one external clock period. Consequently, for the 16 adding operations to be made within one external clock period, the frequency of the internally generated clock signal $S_{fc}$ must be equal to or higher than 16 times the frequency of the external clock signal $S_{fe}$.

If the frequency of the internally generated clock signal $S_{fc}$ is raised more than necessary, the circuit becomes inoperable. It is therefore desired that the frequency of the internally generated clock signal $S_{fc}$ be set to a level not greatly exceeding 16 times the external clock signal $S_{fe}$ or to a level near 16 times the frequency of the external clock signal. As clearly be understood from the above description, generating an internal clock signal of which frequency is controlled to a level near 17 times as high as the frequency of the external clock enables the 16-bit time-division addition-type multiplier to always make 16 adding operations within one external clock period, thereby making the circuit operate correctly.

As described above, forming the clock signal generator of the embodiment on a high-speed semiconductor integrated circuit may automatically generate the internal clock signal $S_{fc}$ of which frequency is an integral multiple of the frequency of the external clock signal, making the internal operation of the above-described circuit faster than the operation external to the circuit.

Because the above-described constitution does not require to lay the wiring for transmitting the ultra high-speed clock signal on the circuit board, the constitution may be provided on a conventional circuit board, thereby making it possible to constitute the entire circuit based on the specifications for low-speed operations.

Figure 6:
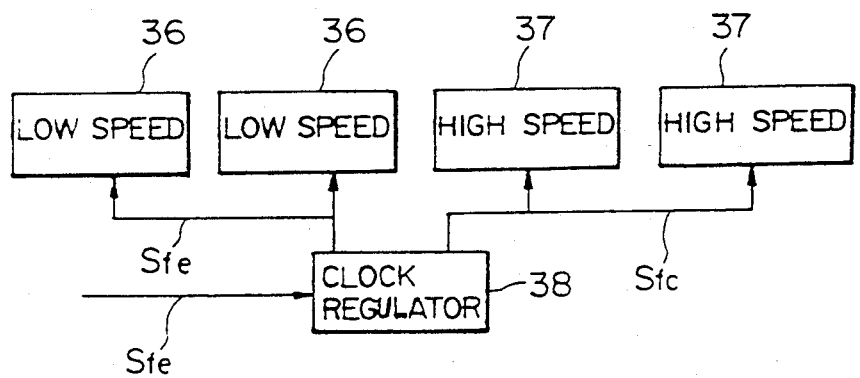
FIG. 6 illustrates a clock signal generating circuit practiced as a second embodiment of the present invention as applied to a circuit constitution in which both low-speed and high-speed integrated circuits exist at the same time.

As shown in FIG. 6, constituting the clock regulating circuit 38 which generates the internal clock signal $S_{fc}$ having a high frequency controlled by the external clock signal $S_{fe}$ by using the embodiment makes it possible to efficiently operate a circuit on which both low-speed and high-speed integrated circuits exist at the same time. On the circuit thus constituted, all the semiconductor integrated circuits can be constituted by using the digital process alone, providing great advantages in circuit design and process.

As described and according to the first aspect of the invention, the clock generator for generating a clock signal having a high frequency controlled by an external clock is constituted by using a ring oscillator for providing variable oscillating frequencies, a divider for dividing the oscillation frequency given from the ring oscillator by a specified number, a phase comparator for comparing the frequency of the output signal given from the divider with the frequency of the external clock signal given from the outside, and an up-down counter for controlling the oscillation frequency of the ring oscillator based on the comparison result from the phase comparator, so that the present invention may be constituted by using the digital integrated circuit technology alone. Consequently, the circuit for generating a clock signal necessary for efficiently operating a circuit on which both low-speed and high-speed semiconductor integrated circuits exist at the same time may be constituted by using the digital integrated circuit technology alone, thereby simplifying the design and manufacturing processes required for manufacturing the conventional clock signal generating circuit for generating a high-frequency clock signal controlled by a clock signal given from the outside.

According to the second aspect of the invention, a circuit on which both low-speed and high-speed integrated circuits exist at the same time may be operated at speeds optimum for each of these circuits while providing an organic relationship between their operating timings.

According to the third aspect of the invention, a semiconductor integrated circuit which operates on the internal clock signal faster than the external clock signal may be constituted by using the digital integrated circuit technology alone, thereby simplifying the process for manufacturing semiconductor integrated circuits which can provide the advantage of high-speed operation. In addition, when operating a circuit on which both low-speed and high-speed semiconductor integrated circuits exist at the same time, generating a high-frequency internal clock signal can make the most of the capability of the high-speed semiconductor integrated circuits in the state in which all semiconductor integrated circuits seem to be operating at low speeds when viewed from the outside. Consequently, it is not required to provide throughout the circuit board the ultra high-speed clock signal for driving the semiconductor integrated circuits which can provide high-speed operations, making a conventional circuit board available for constituting an ultra high-speed circuit.

What is claimed is:

1. A semiconductor integrated circuit having a clock signal generator comprising:

a ring oscillator having a plurality of selectively operable switches connected in series and a plurality of delay units connected with said switches for providing variable oscillating frequencies determined by a sum of the delay times provided by said delay units;

a divider for dividing the oscillation frequency given from said ring oscillator by a specified number;

a phase comparator for comparing the frequency of the output signal given from said divider with the frequency of the external clock signal given from the outside;

an up-down counter for controlling the oscillation frequency of said ring oscillator by operating said switches, based on the comparison result from said phase comparator; and means for operating said switches in response to operation of said up-down counter.

2. A semiconductor integrated circuit having a clock signal generator according to claim 1, wherein said semiconductor integrated circuit is composed of both compound semiconductors and Si semiconductors; and means for supplying said compound semiconductors and said Si semiconductors with clock signals from said clock signal generator.

3. A semiconductor integrated circuit having a clock signal generator comprising:

a ring oscillator having a plurality of selectively operable switches connected in series and a plurality of delay units connected with said switches for providing variable oscillating frequencies determined by a sum of the delay times provided by said delay units;

a divider for dividing the oscillation frequency given from said ring oscillator by a specified number;

a phase comparator for comparing the frequency of the output signal given from said divider with the frequency of an external clock signal given from the outside;

an up-down counter for controlling the oscillation frequency of said ring oscillator by operating said switches, based on the comparison result from said phase comparator; and means for operating said switches in response to operation of said up-down counter;

wherein said clock signal generator, controlled by said externally entered clock signal to generate an internal clock signal of which frequency is higher than the frequency of said externally entered clock signal, outputs both internal and external clock signals.

4. A semiconductor integrated circuit having a clock signal generator comprising:

a ring oscillator having a plurality of selectively operable switches connected in series and a plurality of delay units connected with said switches for providing variable oscillating frequencies determined by a sum of the delay times provided by said delay units;

a divider for dividing the oscillation frequency given from said ring oscillator by a specified number;

a phase comparator for comparing the frequency of the output signal given from said divider with the frequency of an external clock signal given from the outside;

an up-down counter for controlling the oscillation frequency of said ring oscillator by operating said switches, based on the comparison result from said phase comparator; and means for operating said switches in response to operation of said up-down counter;

wherein said clock signal generator generates an internal clock signal having a frequency which is higher than the frequency of said externally entered clock signal to operate the circuit elements internal to said clock signal generator at a high speed.

* * * * *